(12) United States Patent  (10) Patent No.: US 9,274,417 B2
Shih et al.  (45) Date of Patent: Mar. 1, 2016

(54) METHOD FOR LITHOGRAPHY PATTERNING

(71) Applicant: Taiwan Semiconductor Manufacturing Company, Ltd., Hsin-Chu (TW)

(72) Inventors: Hsun-Chuan Shih, Hsinchu County (TW); Yuan-Chih Chu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 198 days.

(21) Appl. No.: 14/030,926

(22) Filed: Sep. 18, 2013

(65) Prior Publication Data

US 2015/0079500 A1  Mar. 19, 2015

(51) Int. Cl.
*G03F 1/72* (2012.01)
*G03F 1/80* (2012.01)

(52) U.S. Cl.
CPC .......................................... *G03F 1/80* (2013.01)

(58) Field of Classification Search
CPC ............................................................ G03F 1/72
USPC .............................................................. 430/5
See application file for complete search history.

(56) References Cited

U.S. PATENT DOCUMENTS

| 8,900,777 | B2 | 12/2014 | Chu | |
| 2003/0134206 | A1* | 7/2003 | Dettmann et al. | 430/5 |
| 2011/0159410 | A1* | 6/2011 | Lin et al. | 430/5 |

* cited by examiner

*Primary Examiner* — Stephen Rosasco
(74) *Attorney, Agent, or Firm* — Haynes and Boone, LLP

(57) ABSTRACT

A method for lithography patterning is disclosed. An exemplary method includes receiving an IC design layout, the IC design layout having an IC pattern and receiving a mask, the mask having a defect. The method further includes making at least one mark on the mask in relation to the defect; positioning the IC design layout over the mask thereby covering the defect by the IC pattern; and patterning the mask with the IC design layout.

20 Claims, 10 Drawing Sheets

METHOD FOR LITHOGRAPHY PATTERNING

BACKGROUND

The semiconductor integrated circuit (IC) industry has experienced rapid growth. During this growth, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, stricter demands have been placed on the lithography process used in such process nodes. Techniques such as extreme ultraviolet (EUV) lithography have been utilized to support critical dimension (CD) requirements of smaller IC devices. Such lithography methods utilize masks which frequently include various defects that introduce fabrication defects in the smaller IC devices. Certain compensation methods, such as repairing mask defects, may be utilized. These compensation methods, however, may significantly increase mask fabrication time and cost. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
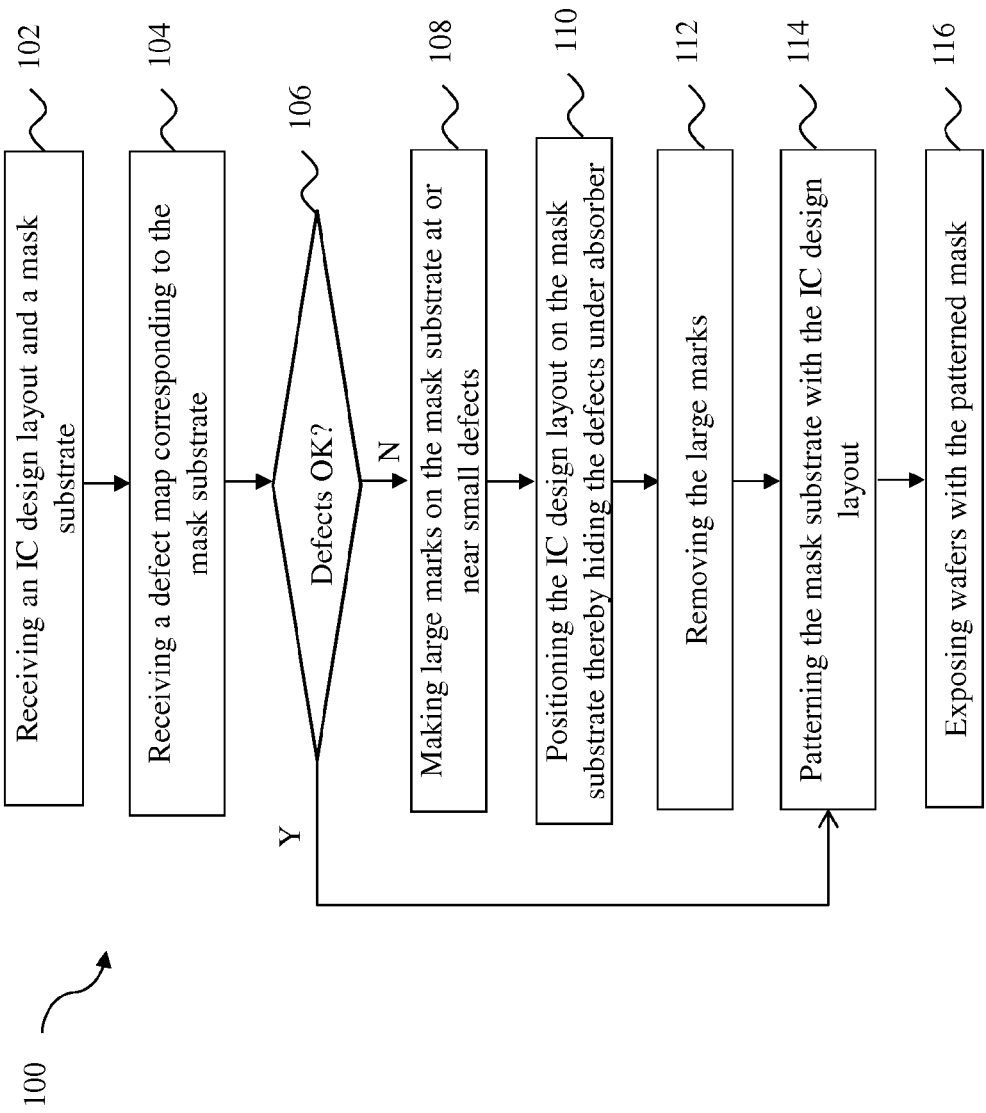
FIG. 1 is a flowchart illustrating a method of lithography patterning according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. Those of ordinary skill in the art will be able to devise various equivalents that, although not explicitly described herein, embody the principles of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technologies continue to evolve, lithography processes have been utilized to achieve increasing functional densities and decreasing device sizes. One form of lithography is extreme ultraviolet (EUV) lithography that utilizes EUV masks. The EUV masks, however, may include various phase defects such as embedded particles or multilayer defects which adversely affect semiconductor devices that are formed using EUV masks that include such defects. To minimize these defects, various approaches have been implemented. For example, tighter tolerances may be placed on mask making processes to reduce or eliminate mask defects, with the tradeoff of higher mask cost. Further, masks with defects may be repaired by various high cost processes once defects are observed. In contrast, as will be evident from the discussion that follows, the present disclosure provides for embodiments of methods that address these concerns without the additional cost associated with the above approaches.

For the sake of example, the following discussion will refer to a lithography patterning system and process used to manufacture semiconductor devices, and more specifically, to an extreme ultraviolet (EUV) lithography process that utilizes EUV masks to pattern a wafer on which one or more semiconductor devices are to be fabricated. Semiconductor devices may include different types of integrated circuit devices, components, and features on a single substrate. The devices may include n-type metal oxide field effect (NMOS) devices, p-type metal oxide field effect (PMOS) devices, input/output (I/O) NMOS, I/O PMOS, flash memory, etc. The semiconductor devices may utilize an interconnect structure to perform electrical routing between the various integrated circuit devices, components, and features on the substrate and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate.

FIG. 1 is a flow chart of a method 100 for fabricating a plurality of masks (also referred to as photomasks or reticles) and exposing wafers with the masks according to various aspects of the present disclosure. The method 100 (FIG. 1) begins at operation 102 where an IC design layout and a mask substrate 200 are provided or received.

An IC design layout includes various geometrical patterns designed for an IC product, based on a specification of the IC product to be manufactured. The geometrical patterns correspond to patterns of metal, oxide, or semiconductor layers that make up the various components of the IC device to be fabricated. The various layers combine to form various IC features. For example, a portion of an IC design layout includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. An IC design layout is presented in one or more data files, such as a GDSII file or DFII file, having information of the geometrical patterns. In the present embodiment, the IC design layout is to be patterned onto the mask substrate 200.

Figure 2A:
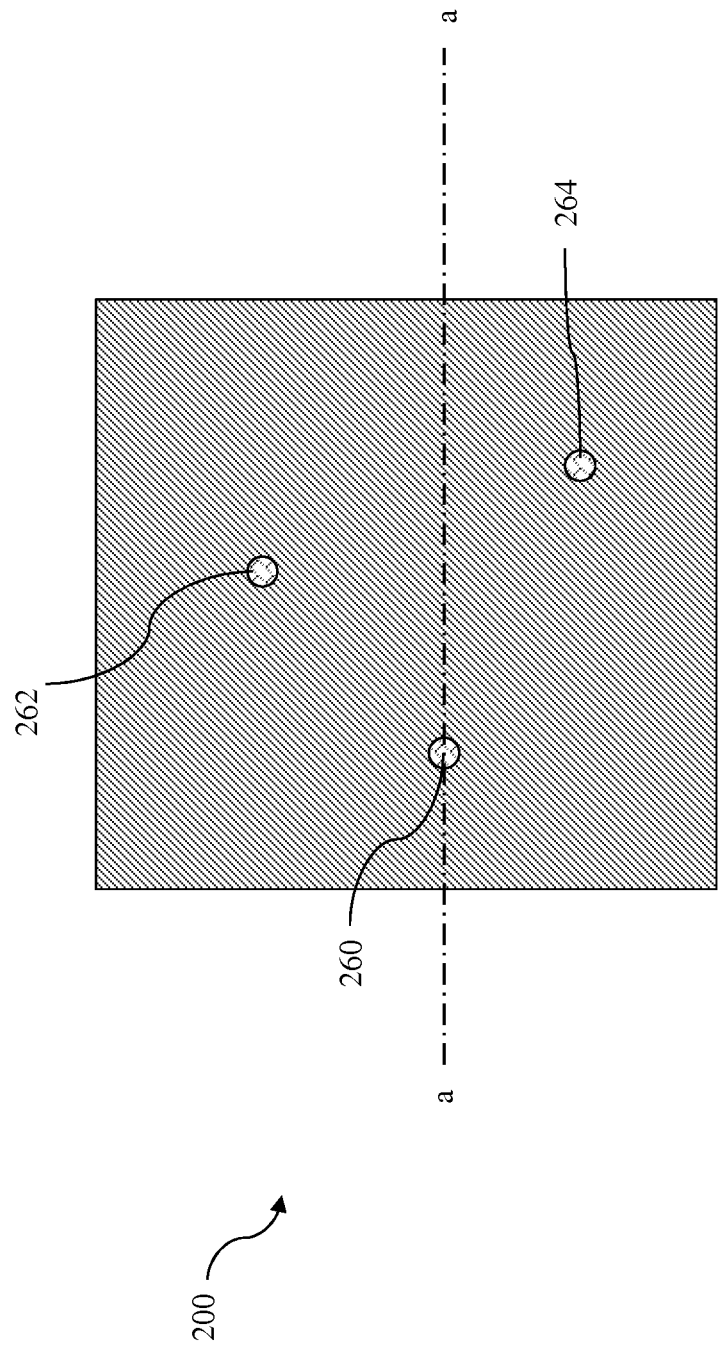
FIGS. 2A and 2B illustrate top and cross sectional views of an embodiment of an EUV mask according to various aspects of the present disclosure.
Figure 2B:
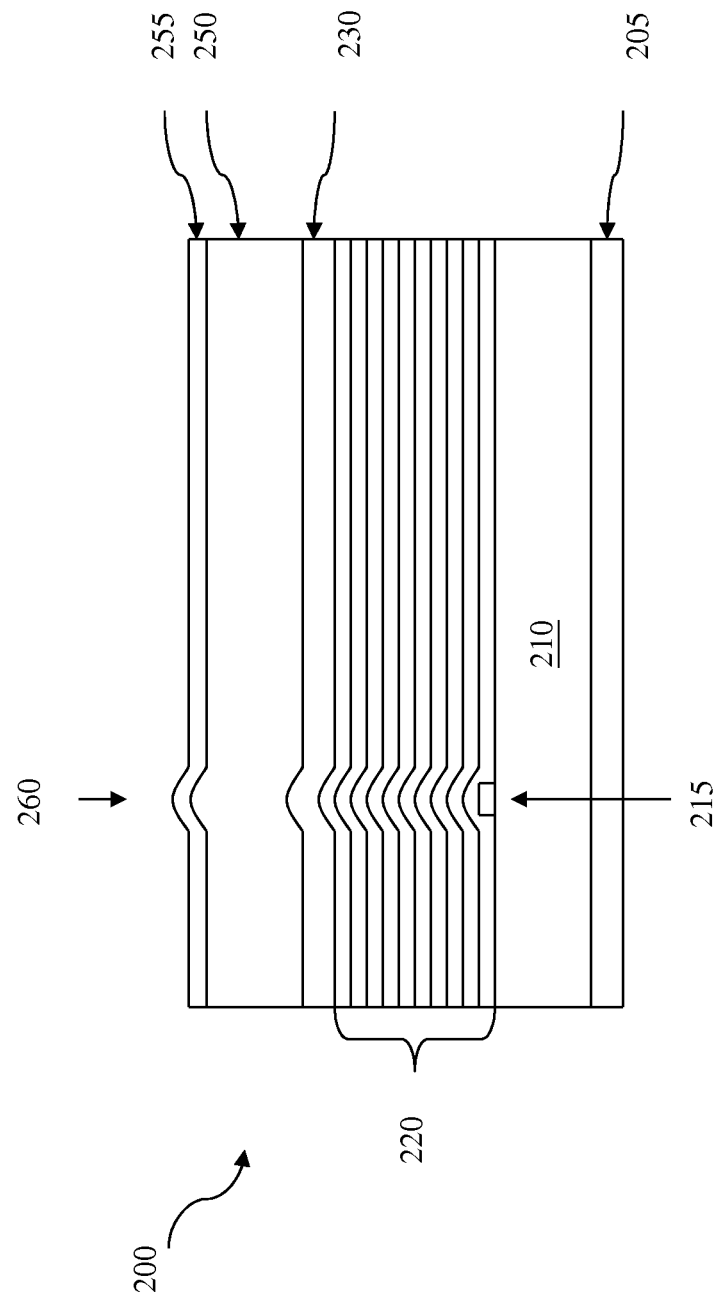

Referring to FIGS. 2A and 2B, in the present embodiment, the mask substrate 200 is an EUV mask substrate. The EUV mask substrate 200, for example, may be provided by the same manufacturer that utilizes the EUV mask substrate 200 to fabricate integrated circuit devices. Alternatively, the EUV mask substrate 200, for example, may be received from a vendor, which may be a third party.

Referring to FIG. 2A, in the present embodiment, the EUV mask substrate 200 includes one or more phase defects 260, 262 and 264. The defects may be bump defects or pit defects or a combination thereof. The defects may vary in location, shape, size, depth, orientation, etc. The location, shape, size, depth, and orientation may take any random form.

FIG. 2B is a cross sectional view of the EUV mask substrate 200 along a dotted a-a line of FIG. 2A. Referring to FIG. 2B, the EUV mask substrate 200 includes a material layer 210, a reflective multilayer (ML) 220 deposited over the material layer 210, a capping layer 230 deposited over the reflective ML 220, an absorber layer 250 deposited over the capping layer 230, and a protection layer 255 deposited over the absorber layer 250. In addition, a conductive layer 205 may be deposited under the material layer 210, as shown in FIG. 2B, for electrostatic chucking purposes. In an embodiment, the conductive layer 205 includes chromium nitride (CrN). Other configurations and inclusion or omission of various items in the EUV mask substrate 200 may be possible.

The material layer 210 serves to minimize image distortion due to mask heating by intensified EUV radiation. In some embodiments, the material layer 210 may include low thermal expansion material (LTEM). The LTEM may include fused silica, fused quartz, calcium fluoride ($CaF_2$), silicon carbide, silicon oxide-titanium oxide alloy and/or other suitable LTEM.

The reflective multilayer (ML) 220 is deposited over the material layer 210. The ML 220 includes a plurality of film pairs, such as molybdenum-silicon (Mo/Si) film pairs (e.g., a layer of molybdenum above or below a layer of silicon in each film pair). Alternatively, the ML 220 may include molybdenum-beryllium (Mo/Be) film pairs, or any two materials or two material combinations with large difference in refractive indices and small extinction coefficients. The thickness of each layer of the ML 220 depends on the wavelength and an incident angle of an EUV radiation projected onto the mask substrate 200 after it has been patterned. For a specified incident angle, the thickness of each layer of the ML 220 may be adjusted to achieve maximal constructive interference for radiations reflected at different interfaces of the ML 220. A typical number of film pairs are 20-80, however any number of film pairs are possible. In an embodiment, the ML 220 includes 40 pairs of layers of Mo/Si. Each Mo/Si film pair has a thickness of about 7 nanometer (nm), e.g., about 3 nm for Mo and about 4 nm for Si. In this case, a reflectivity of about 70% is achieved.

The capping layer 230 is deposited over the ML 220. The capping layer 230 has different etching characteristics from the absorber layer 250 and acts as an etching stop layer in a patterning or repairing process of the absorber layer 250. In the present embodiment, the capping layer 230 includes ruthenium (Ru) or Ru compounds such as ruthenium-boron (RuB) or ruthenium-silicon (RuSi).

The absorber layer 250 is deposited over the capping layer 230. In the present embodiment, the absorber layer 250 absorbs an EUV radiation projected thereon. The absorber layer 250 may include a single layer or multiple layers from a group of chromium (Cr), chromium oxide (CrO), titanium nitride (TiN), tantalum nitride (TaN), tantalum (Ta), titanium (Ti), or aluminum-copper (Al-Cu), palladium, tantalum boron nitride (TaBN), aluminum oxide (AlO), molybdenum (Mo), or other suitable materials.

The protection layer 255 is deposited over the absorber layer 250, for example, to protect the absorber layer 250 from oxidation when the mask substrate 200 is in a cleaning process. Furthermore, some of the absorber layer 250 may have poor cleaning resistance and the protection layer 255 can enhance the cleaning durability of the EUV mask substrate 200. In the present embodiment, the protection layer 255 includes tantalum boron oxide (TaBO).

One or more of the layers 205, 220, 230, 250 and 255 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods.

Referring again to FIG. 2B, in the present embodiment, the mask defect 260 is caused by a buried bump defect 215, on the surface of the material layer 210 (beneath the ML 220) or embedded in the ML 220. The defect 215 may be formed when fabricating the material layer 210 or the ML 220, or during other processes. In other embodiments, the EUV mask substrate 200 may include pit defects or a combination of bump defects and pit defects. Either a bump defect or a pit defect changes profile of the multilayer surface and therefore distorts a reflected radiation beam from the multilayer surface. In some embodiments, a defect in a reflective ML of a reflective EUV mask, such as the defect 260, is also referred to as a phase defect.

The method 100 (FIG. 1) proceeds to operation 104 where a defect map is provided/received corresponding to the EUV mask substrate 200. The defect map may be provided by the manufacturer that forms the EUV mask substrate 200 and utilizes the final EUV mask to fabricate integrated circuit devices. Alternatively, for example, the defect map may be received from the same vendor from which the EUV mask substrate 200 was received. The defect map corresponds to the EUV mask substrate 200 such that it maps out locations of the various defects 260, 262 and 264. The defect map may include location/coordinates, size, shape, orientation, and images of defects. The defect map may be stored in a file that is accessible by a computer operable to generate radiation beam writer data. The file, for example, may be a text file or a file specific to the apparatus utilizing such file. The defect map may be generated by a mask inspection tool, such as KLA-Tencor's Teron 610 series. However, a mask inspection tool generally has a limited resolution in identifying a phase defect location. For example, an optical scanning inspection tool has a resolution about 100 nm. An atomic force microscopy (AFM) may offer resolution about less than 1 nm. However, it is generally impractical to use an AFM to fully inspect a mask because it can only inspect a very small area of the mask at a time.

The method 100 (FIG. 1) proceeds to operation 106 where the phase defects 260, 262 and 264 are evaluated. In some embodiments, the defect map includes image data of the phase defects, and evaluating the phase defects includes using the image data to determine dimensions of the phase defects. In an embodiment, if the dimensions of the phase defects are within a specification, for example smaller than 3 nm in height or roughness, the mask substrate 200 may be considered as phase defect free and the method 100 proceeds to operation 114 where the mask substrate 200 is patterned with the IC design layout. In another embodiment, operation 106 may include running a simulation to determine an impact of the phase defects when patterning a resist layer deposited over a wafer substrate. If at least one of the phase defects has dimensions out of the specification or is simulated to have unacceptable printing effects, the method 100 proceeds to operation 108 to mitigate the effects of such phase defects.

In the present embodiment, mitigating the effects of the phase defects 260, 262 and 264 is accomplished by hiding the phase defects underneath the absorber layer 250 when the mask substrate 200 is being patterned with the IC design layout. This aspect will be discussed in more details in a later section of the present disclosure. An embodiment of such an approach uses locations of the phase defects, for example, from a defect map. As discussed above, a defect map generated by an inspection tool may have a resolution about 100 nm, which may not be adequate for patterning smaller IC devices. In the present disclosure, another tool which can more accurately locate the phase defects is therefore used. For example, PROVE®, a photomask registration and overlay metrology tool by Carl Zeiss, may be used to locate the phase defects, 260, 262 and 264, with a resolution about 1 nm or better. However, an overlay metrology tool, such as PROVE®, generally cannot detect small phase defects. For example, a phase defect that is about 6 nm tall with a base that is about 150 nm long and about 90 nm wide may pass the overlay metrology tool undetected. In the present disclosure, the mask substrate 200 is preprocessed, as discussed below, before it is handled by an overlay metrology tool.

Figure 3:
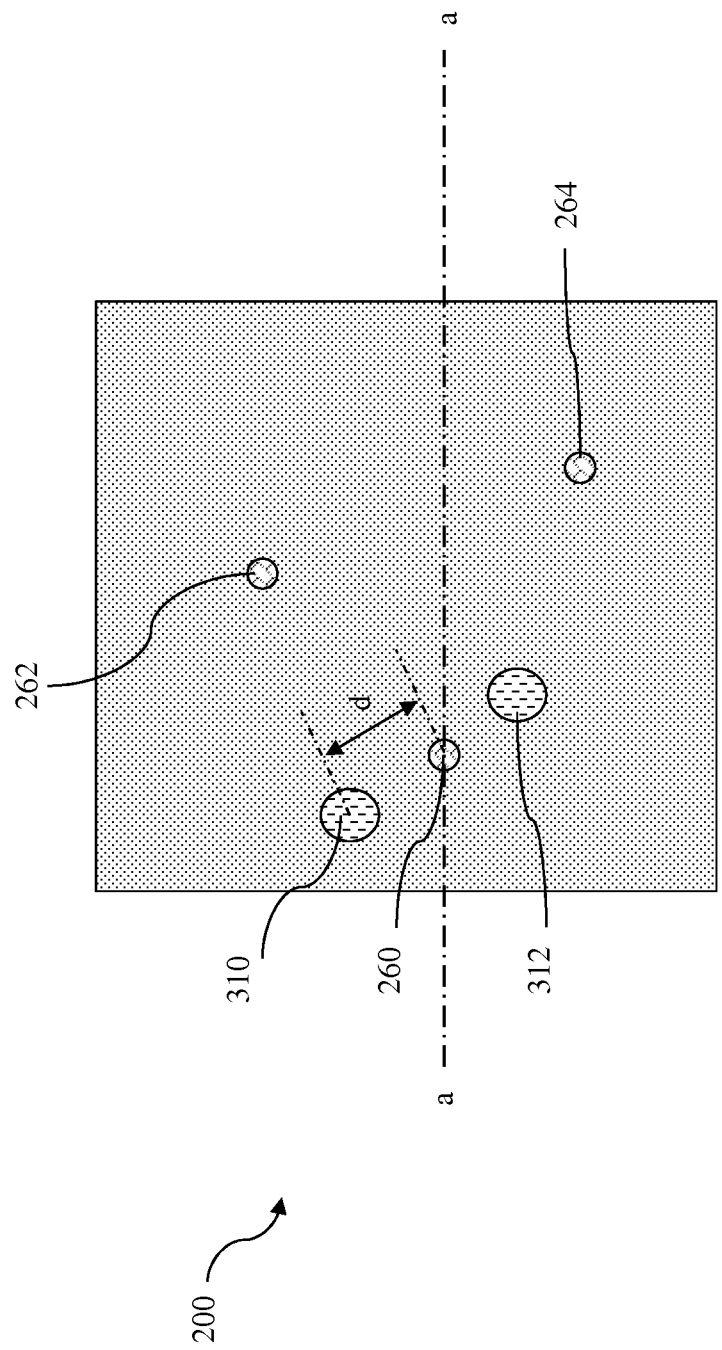
FIG. 3 illustrates a top view of an embodiment of an EUV mask with large correction marks according to various aspects of the present disclosure.

The method 100 (FIG. 1) proceeds to operation 108 where the phase defects, especially those that are smaller than certain dimension thresholds, are marked with special markings, called "DC marks" in the present disclosure. One example of a DC mark would be a chemical drop or deposit on the mask. Referring to FIG. 3, for illustrative purposes, the phase defects 262 and 264 are large enough that they do not need DC marks while the phase defect 260 is a small phase defect that two DC marks, 310 and 312, are deposited onto the mask substrate 200 over the protection layer 255 near the phase defect 260. In an embodiment, one DC mark may be used. In another embodiment, a different number of DC marks may be used. In the present disclosure, the DC marks, 310 and 312, includes chromium (Cr), although other suitable materials or compositions are possible. The DC marks, 310 and 312, are large enough to be detected by the selected overlay metrology tool, such as PROVE®. For example, the DC marks, 310 and 312, may be about 30 nm tall with a base about 100 nm long and about 100 nm wide. The DC marks 310 and 312 are deposited at such a distance from the phase defect 260 that the DC marks 310 and 312 and the phase defect 260 are simultaneously within a viewing area of the selected overlay metrology tool, such as PROVE®. For example, a distance "d" (FIG. 3) between the DC mark 310 and the phase defect 260 is less than about 1 micron (μm) in the present disclosure. Moreover, in the present disclosure, the phase defect 260 is located on a straight line between the DC marks 310 and 312. However, other configurations are possible so long as the phase defect 260 can be located with respect to a given location of an associated DC mark, such as the DC mark 310. Depositing the DC marks, 310 and 312, can be done by some e-beam mask repair tool, such as MeRit® by Carl Zeiss. After the DC marks 310 and 312 are deposited onto the mask substrate 200, their positions relative to the phase defect 260 are measured by a high resolution inspection tool, such as an atomic force microscopy (AFM). Such information is stored in a data file suitable for access by the selected overlay metrology tool.

The method 100 (FIG. 1) proceeds to operation 110 where the IC design layout is positioned within the mask substrate 200 such that the phase defects 260, 262 and 264 will be hidden underneath the absorber layer 250 once the mask substrate 200 is patterned with the IC design layout.

Figure 4:
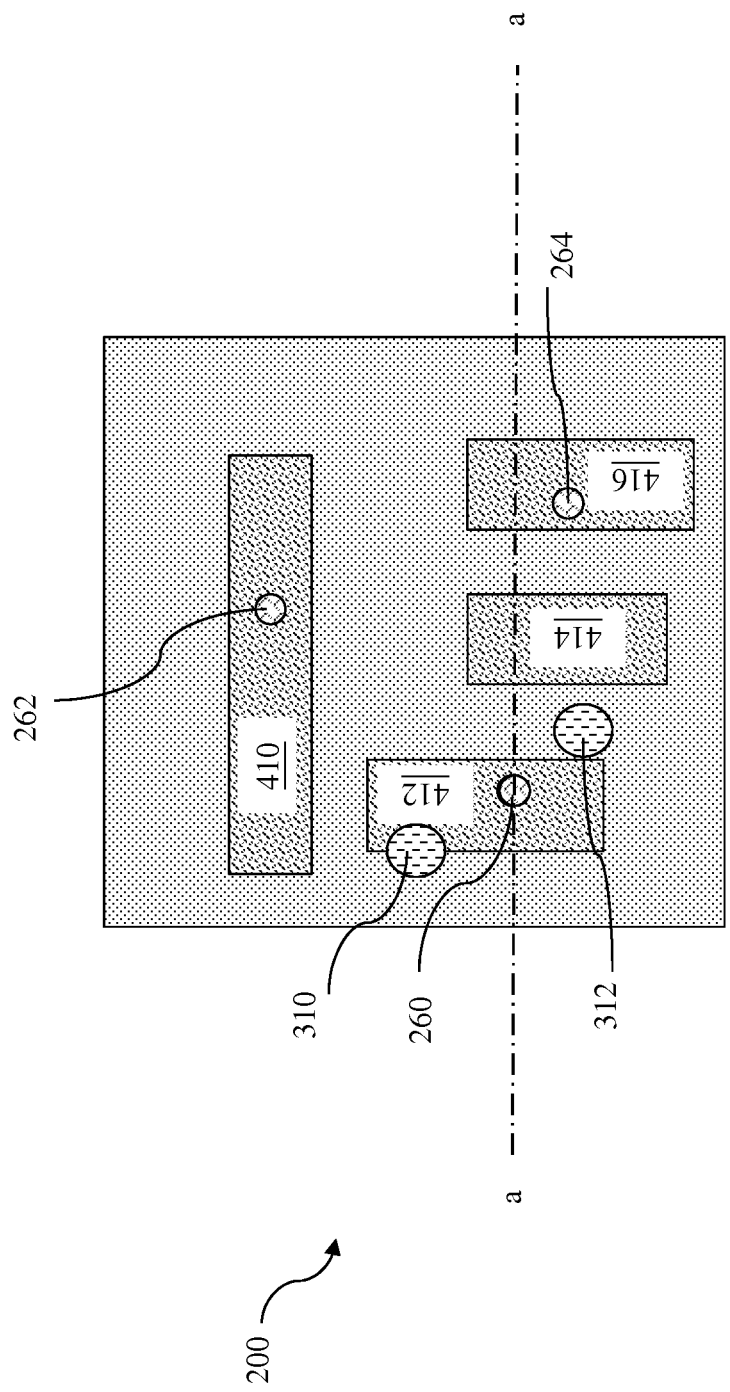
FIG. 4 illustrates a top view of an IC design layout positioned over an embodiment of an EUV mask with large correction marks according to various aspects of the present disclosure.

Referring to FIG. 4, in the present embodiment, the IC design layout includes geometrical patterns 410, 412, 414 and 416. These patterns correspond to IC features, such as active regions, gate electrodes, source and drain, metal lines or vias of an interlayer interconnection, and openings for bonding pads, to be formed in a semiconductor substrate (such as a silicon wafer) and various material layers disposed on the semiconductor substrate. A file containing information of these geometrical patterns is provided to and processed by an overlay metrology tool, such as PROVE®. At the same time, the tool detects and locates the phase defects 260, 262 and 264. The tool may detect and locate these phase defects directly or indirectly. For example, in the present embodiment, the phase defects 262 and 264 have such large dimensions that they are detected and located by the tool directly. For example, in the present embodiment, although the phase defect 260 is not large enough to be detected by the tool directly, the deposited DC marks 310 and 312 are large enough to be detected and located by the tool directly thereby the location of the phase defect 260 is known by the tool based on information gained in operation 108. After knowing the locations and dimensions of both the geometrical patterns, 410, 412, 414 and 416, and the phase defects, 260, 262 and 264, operation 110 positions the IC design layout within the mask substrate 200 such that the geometrical patterns are directly over the phase defects. Referring again to FIG. 4, in the present embodiment, the geometrical patterns 410, 412 and 416 are directly over the phase defects 262, 260 and 264 respectively. When these geometrical patterns are formed on the mask substrate 200 in a later operation, the phase defects 260, 262 and 264 will be hidden underneath the absorber layer 250 thereby having no impact on an EUV lithography process. In another embodiment, if not all phase defects are hidden underneath the geometrical patterns, operation 110 positions the IC design layout within the mask substrate 200 such that an impact of the exposed phase defects is minimized.

The method 100 (FIG. 1) proceeds to operation 112 where the DC marks 310 and 312 are removed from the mask substrate 200. Removing the DC marks 310 and 312 may be done by an etching process, such as a plasma etching process or a wet etching process. For example, a gas mixture containing oxygen and chlorine may be charged and applied to remove the DC marks 310 and 312 that contain chromium.

The method 100 (FIG. 1) proceeds to operation 114 where the mask substrate 200 is patterned with the IC design layout that includes the geometrical patterns 410, 412, 414 and 416. Patterning the mask substrate 200 includes forming a resist layer over the protection layer 255; writing the IC design layout on the resist layer using a radiation source, such as an e-beam writer; etching the protection layer 255 and the absorber layer 250 with the patterned resist layer as an etch mask; and thereafter removing the resist layer. The resist layer may be formed by a spin coating process or any suitable process. The e-beam writing process may be implemented in a raster scan mode or a vector scan mode, and may utilize single beam or multi-beam e-beam writing. The e-beam may be Gaussian beam or shaped beam. In an embodiment, the e-beam is applied to the resist layer in a projection-mode. The process of etching the protection layer 255 and the absorber layer 250 may be a wet etching process, a dry etching process, or a combination thereof. The resist layer is subsequently removed by any suitable process, such as wet stripping or plasma ashing. Additional processing such as chemical mechanical polishing (CMP) processes, cleaning processes, or other suitable process may be performed after the mask substrate 200 has been patterned.

Figure 5A:
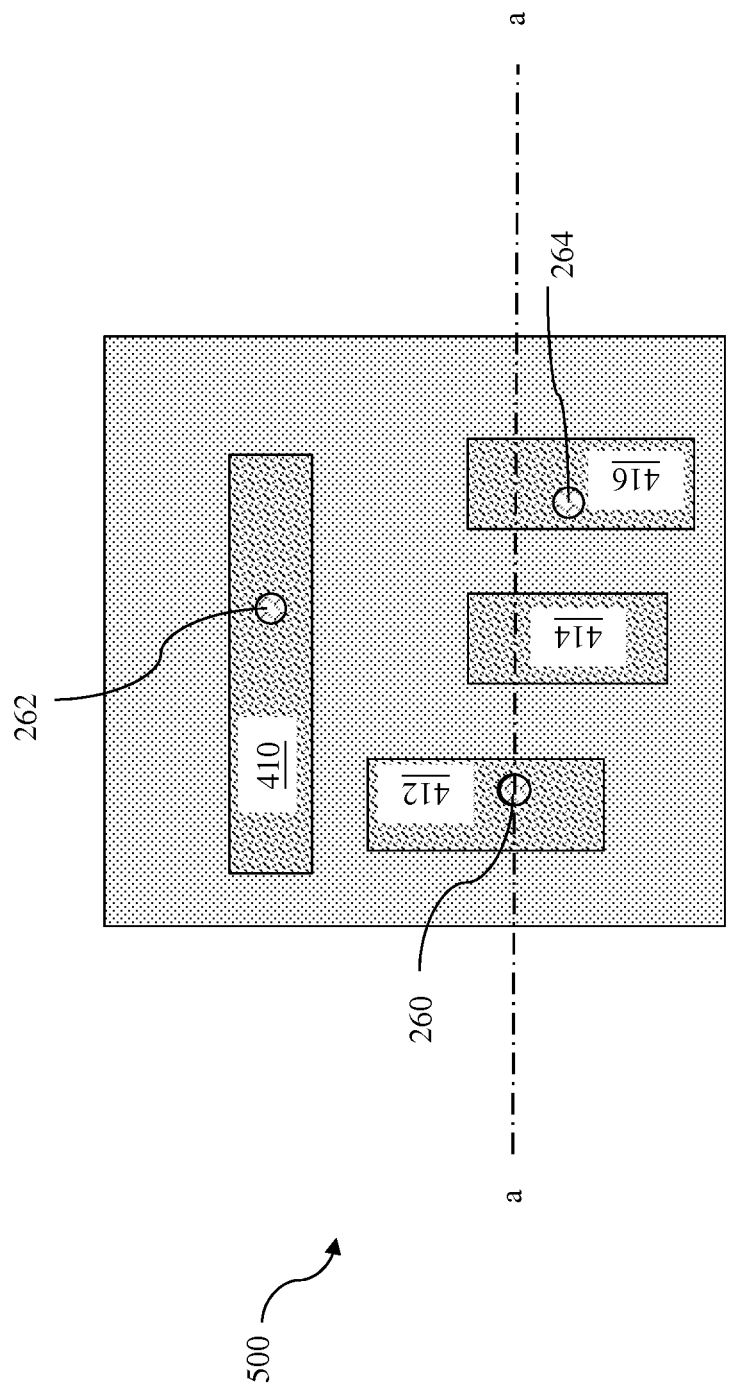
FIGS. 5A and 5B illustrate top and cross sectional views of an embodiment of a patterned EUV mask according to various aspects of the present disclosure.
Figure 5B:
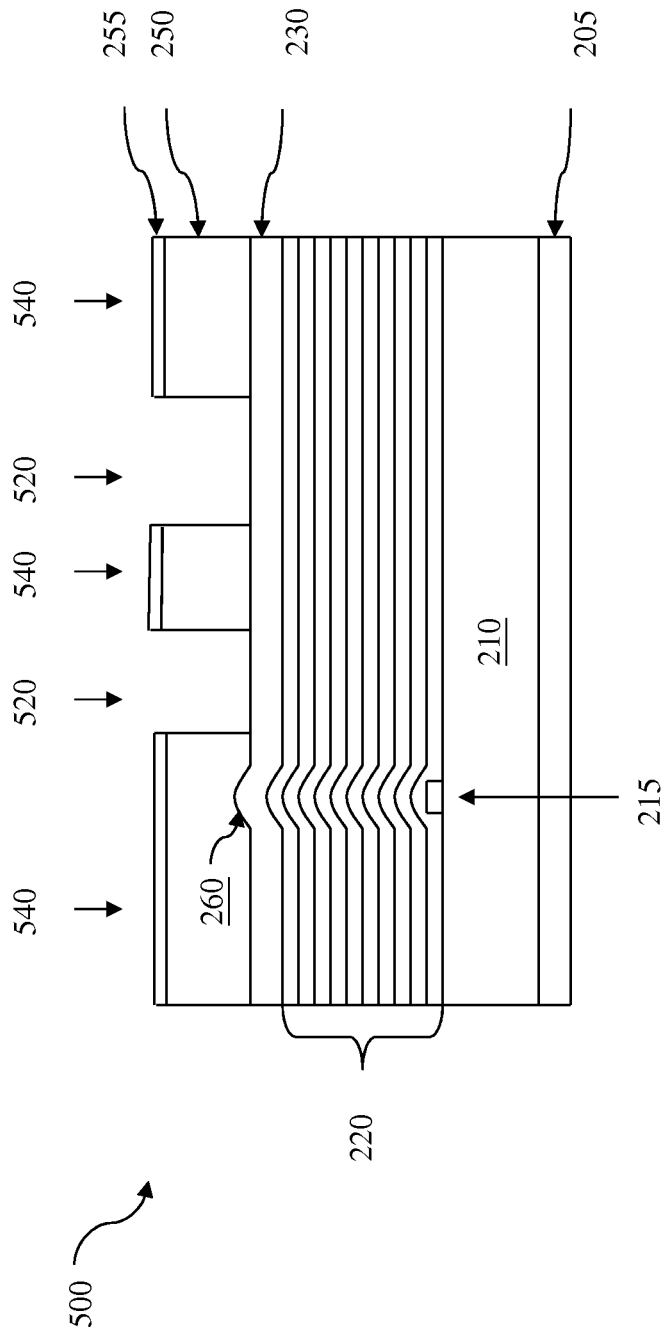

FIG. 5A shows a top view of a portion of a patterned EUV mask 500 which is the EUV mask substrate 200 patterned with the IC design layout in the absorber layer 250. FIG. 5B show a cross sectional view of a portion of the patterned EUV mask 500 taken along the dotted a-a line of the FIG. 5A. Referring to FIG. 5B, the patterned EUV mask 500 includes absorptive regions 540 and reflective regions 520. The phase defect 260 is underneath one of the absorptive regions 540, therefore it will not distort a radiation beam projected onto the patterned EUV mask 500.

The method 200 (FIG. 2) proceeds to operation 116 where the patterned EUV mask 500 is used to pattern one or more layers on a wafer for fabricating the IC devices.

Figure 6:
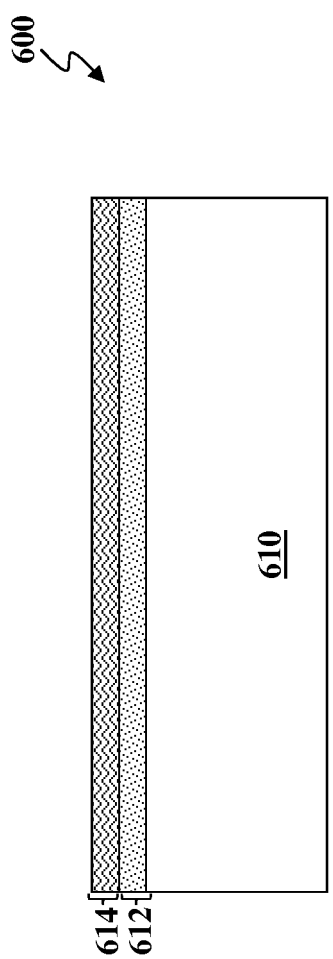
FIG. 6 illustrates a cross sectional view of an embodiment of a semiconductor wafer according to various aspects of the present disclosure.

Referring to FIG. 6, a diagrammatic cross-sectional side view of a wafer 600 (such as a semiconductor wafer) is illustrated. The wafer 600 has been simplified for the sake of clarity to better understand the inventive concepts of the present disclosure. Additional features can be added in the wafer 600, and some of the features described below can be replaced or eliminated in other embodiments of the wafer 600.

Still referring to FIG. 6, the wafer 600 includes a substrate 610. The substrate 610, for example, can be a bulk substrate or a silicon-on-insulator (SOI) substrate. The substrate 610 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. A SOI substrate can be fabricated using separation by implantation of oxygen (SIMOX), wafer bonding, and/or other suitable methods. The substrate 610 may be a p-type substrate, an n-type substrate, or a combination thereof. Although the present disclosure provides various examples of a substrate, the scope of the disclosure and claims should not be limited to the specific examples unless expressly claimed.

Still referring to FIG. 6, the substrate 610 includes one or more layers 612 to be patterned. The layers may be, for example, dielectric layers, non-dielectric layers, metal layers, etc. The one or more layers 612 may be formed by chemical vapor deposition (CVD), physical vapor deposition (PVD), atomic layer deposition (ALD), high density plasma CVD (HDPCVD), plating, other suitable methods, and/or combinations thereof. Formed over the layers 612 is a resist layer 614. The resist layer 614 includes a material sensitive to EUV processing. The resist layer 614 may be formed by a spin coating process or any suitable process. Other steps may be further implemented after the coating of the resist layer 614. For example, a baking process may be applied to the resist layer 614 to partially drive out solvents (used in the spin coating process) from the resist layer 614.

Patterning the one or more layers 612 using the EUV mask 500 includes exposing the resist layer 614 to an EUV radiation with an aerial image of the EUV mask 500; developing the resist layer 614 and removing portions of the resist layer that are exposed to the EUV radiation (or unexposed, depending on the type of the resist layer 614), and etching the one or more layers 612 with the patterned resist layer 614 as an etch mask. Further operations to the wafer 600 may be performed, such as forming circuit structures in the substrate 610.

Figure 7A:
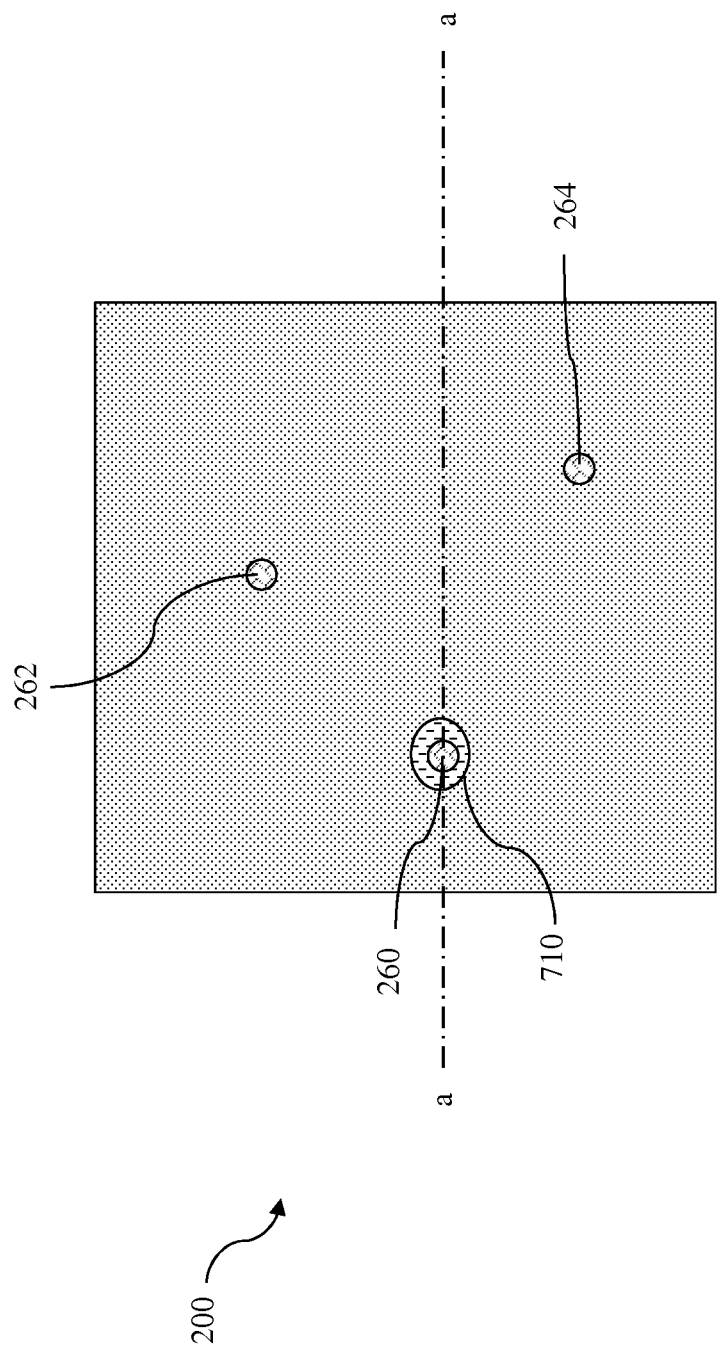
FIGS. 7A and 7B illustrate top and cross sectional views of an embodiment of an EUV mask with a large correction mark (cavity) according to various aspects of the present disclosure.
Figure 7B:
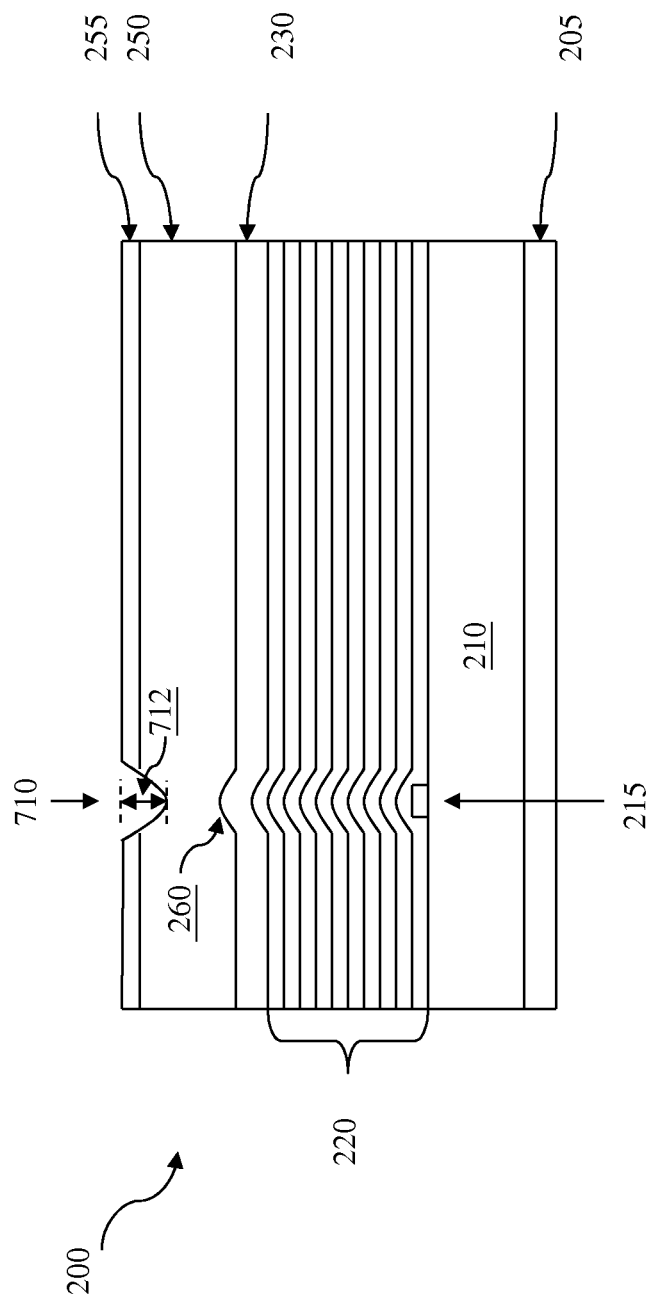

As discussed with reference to operation 108 (FIG. 1), an embodiment of the present disclosure makes large marks on the EUV mask substrate 200 by depositing DC marks containing chromium (Cr) (FIG. 3). Other embodiments of making large marks on the EUV mask substrate 200 are possible. FIGS. 7A and 7B illustrate another embodiment of the present disclosure. Referring to FIGS. 7A and 7B, a cavity 710 is formed into the absorber layer 250 directly over the phase defect 260. On the one hand, the cavity 710 has sufficiently large dimensions to be detected and located by an overlay metrology tool, such as PROVE®. On the other hand, a depth 712 of the cavity 710 is controlled such that the absorber layer 250 underneath the cavity 710 still has enough material to effectively absorb an EUV radiation projected thereon. In an embodiment of the present disclosure, the absorber layer 250 is about 70 nm and the depth 712 is about 15 to 20 nm. The cavity 710 may be formed by various processes. In an embodiment, the cavity 710 is formed by punching the mask substrate 200 using a mask repair tool with a probe tip. In addition, the cavity 710 may or may not be removed by operation 112. In an embodiment, a combination of the DC marks (FIG. 4) and cavity marks (FIG. 7) may be utilized by operation 108.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a lithography patterning method. The method includes receiving an IC design layout, the IC design layout having an IC pattern and receiving a mask, the mask having a defect. The method further includes making at least one mark on the mask in relation to the defect; positioning the IC design layout over the mask thereby covering the defect by the IC pattern; and patterning the mask with the IC design layout.

In another exemplary aspect, the present disclosure is directed to a method of EUV lithography patterning. The method includes receiving an IC design layout, the IC design layout having an IC pattern and receiving an EUV mask, the EUV mask having a phase defect. The method further includes determining a size of the phase defect and making at least one mark on the EUV mask in relation to the phase defect if and only if the size of the phase defect is smaller than a threshold. The method further includes positioning the IC design layout over the EUV mask, with the IC pattern covering the phase defect. The method further includes patterning the EUV mask with the IC design layout thereby covering the phase defect underneath an absorber layer of the patterned EUV mask.

In another exemplary aspect, the present disclosure is directed to a method of fabricating an IC. The method includes receiving a design layout of the IC and receiving an EUV mask and a defect map, the defect map identifying a plurality of phase defects of the EUV mask. The method further includes selecting at least one of the phase defects, wherein a dimension of the selected phase defect is smaller than a threshold. The method further includes making at least one mark on the EUV mask in relation to the selected phase defect and positioning the IC design layout over the EUV mask thereby covering the plurality of phase defects with the IC design layout. The method further includes patterning the EUV mask with the IC design layout and exposing an image on a substrate using the patterned EUV mask and an EUV lithography process.

What is claimed is:

1. A method comprising:
    receiving an IC design layout, wherein the IC design layout includes an IC pattern;
    receiving a mask for receiving the IC design layout, wherein the mask includes a defect;
    making at least one mark on the mask in relation to the defect by one of: forming a cavity into the mask directly over the defect, and depositing the at least one mark over a top surface of the mask at a first distance from the defect;
    positioning the IC design layout over the mask thereby covering the defect by the IC pattern; and
    after the positioning, patterning the mask with the IC design layout.

2. The method of claim 1, wherein the defect has a dimension smaller than a threshold of the IC design layout.

3. The method of claim 1, wherein the mask is an extreme ultraviolet (EUV) mask, and wherein the patterning of the mask includes:
    forming a resist layer over an absorber layer of the mask;
    modifying the resist layer using the IC design layout to include a plurality of openings; and
    etching the absorber layer through the plurality of openings thereby forming the IC pattern in the absorber layer.

4. The method of claim 1, wherein the making of the at least one mark is by the forming of the cavity, wherein:
    the mask is an extreme ultraviolet (EUV) mask having an absorber layer;
    the absorber layer has a first thickness; and
    a depth of the cavity is substantially smaller than the first thickness.

5. The method of claim 1, wherein the making of the at least one mark is by the depositing of the at least one mark, further comprising, before the patterning of the mask with the IC design layout:
    removing the at least one mark.

6. The method of claim 5, wherein:
    the mask is an extreme ultraviolet (EUV) mask having an absorber layer and a protection layer over the absorber layer;
    the protection layer includes tantalum boron oxide;
    the at least one mark includes chromium; and
    the removing the at least one mark includes a plasma etching process.

7. The method of claim 1, wherein:
    the mask is an extreme ultraviolet (EUV) mask; and
    the defect is a phase defect.

8. The method of claim 1, wherein the defect is one of: a bump defect and a pit defect.

9. The method of claim 1, further comprising:
    receiving a wafer, the wafer having a substrate and a resist layer over the substrate; and
    exposing the resist layer to a radiation using the patterned mask.

10. The method of claim 9, wherein:
    the substrate includes silicon; and
    the radiation is an EUV radiation.

11. A method comprising:
    receiving an IC design layout and an EUV mask, wherein the IC design layout includes an IC pattern and the EUV mask includes a phase defect;
    determining a size of the phase defect;
    depositing at least one mark on the EUV mask in relation to the phase defect if and only if the size of the phase defect is smaller than a threshold;
    positioning the IC design layout over the EUV mask, wherein the IC pattern covers the phase defect; and
    patterning the EUV mask with the IC design layout thereby covering the phase defect underneath an absorber layer of the patterned EUV mask.

12. The method of claim 11, further comprising:
    receiving a wafer, the wafer having a silicon substrate and a resist layer over the silicon substrate; and
    exposing the resist layer to an EUV radiation using the patterned EUV mask.

13. The method of claim 11, further comprising:
    etching the at least one mark before the patterning of the EUV mask with the IC design layout.

14. The method of claim 11, wherein the determining the size of the phase defect includes:
    using a defect map associated with the EUV mask, wherein the defect map identifies the phase defect.

15. A method comprising:
    receiving an IC design layout, an EUV mask, and a defect map, wherein the defect map identifies a plurality of phase defects of the EUV mask;
    selecting at least one of the phase defects, wherein a dimension of the selected phase defect is smaller than a threshold;
    forming a cavity in an absorber layer of the EUV mask directly over the selected phase defect, wherein a depth of the cavity is less than a thickness of the absorber layer and a dimension of the cavity on a surface of the EUV mask is greater than the threshold;
    positioning the IC design layout over the EUV mask thereby covering the plurality of phase defects with the IC design layout; and
    patterning the EUV mask with the IC design layout.

16. The method of claim 11, wherein the at least one mark includes two marks and the phase defect is located on a straight line between the two marks.

17. The method of claim 11, wherein the at least one mark include chromium.

18. The method of claim 11, wherein the at least one mark and the phase defect are simultaneously within a viewing area of an overlay metrology tool.

19. The method of claim 15, wherein the forming of the cavity includes punching the surface of the EUV mask directly over the selected phase defect.

20. The method of claim 15, further comprising:
   depositing at least one mark on the EUV mask near another phase defect for locating the another phase defect.

* * * * *